United States Patent [19]

Kumar

[11] Patent Number: 5,196,102
[45] Date of Patent: Mar. 23, 1993

[54] METHOD AND APPARATUS FOR APPLYING A COMPOUND OF A METAL AND A GAS ONTO A SURFACE

[75] Inventor: Nalin Kumar, Austin, Tex.

[73] Assignee: Microelectronics and Computer Technology Corporation, Austin, Tex.

[21] Appl. No.: 741,928

[22] Filed: Aug. 8, 1991

[51] Int. Cl.⁵ ............................................. C23C 14/32
[52] U.S. Cl. .................................. 427/528; 118/723; 204/298.05; 204/298.07; 427/576
[58] Field of Search ............... 204/192.31, 298.05, 204/298.07; 118/723; 50.1; 437/27, 30, 39

[56] References Cited

U.S. PATENT DOCUMENTS

| | | | |
|---|---|---|---|
| 4,088,926 | 5/1978 | Fletcher et al. | 315/111.21 |
| 4,572,842 | 2/1986 | Dietrich et al. | 427/39 |
| 4,710,283 | 12/1987 | Singh et al. | 204/298.01 |
| 4,805,555 | 2/1989 | Itoh | 118/719 |
| 5,110,435 | 5/1992 | Haberland | 204/192.31 |

OTHER PUBLICATIONS

U.S. Ser. No. 07/653,609 entitled "Method of Making Bonding Bumps" filed Feb. 11, 1991.
C. D'Cruz and K. Pourrezaei, "Ion Cluster Emission and Deposition from Liquid Gold Ion Sources," *Journal of Applied Physics*, vol. 58(7) Oct. 1, 1985, pp. 2427–2430.

*Primary Examiner*—Aaron Weisstuch
*Attorney, Agent, or Firm*—Fulbright & Jaworski

[57] ABSTRACT

A method of applying a compound of a metal and a reactive gas onto a surface by depositing a metal from a liquid metal cluster ion source onto said surface in the presence of a gas on the surface to combine with the deposited metal while isolating the gas from the source of the metal cluster ions.

11 Claims, 2 Drawing Sheets

METHOD AND APPARATUS FOR APPLYING A COMPOUND OF A METAL AND A GAS ONTO A SURFACE

BACKGROUND OF THE INVENTION

The present invention is directed to a method and apparatus for applying a compound of a metal and a reactive gas onto a surface, and more particularly, to provide a repair tool for repairing a flat panel display. In particular, the present invention may be used to repair an indium tin oxide (ITO) or zinc oxice (ZnO) transparent conductor. This can be accomplished by using an alloy metal source oft he desired metal which is deposited by a liquid metal cluster ion source and combined with an atomic oxygen source to produce oxide thin films.

Almost all types of flat panel displays require use of transparent conductors to define the pixels. This is true for liquid crystal, electro-luminescent, field emission and plasma displays. As these display sizes are getting bigger and bigger, it is becoming more and more important to be able to repair a small number of defects on each one of these panels. Several techniques exist for the repair of electrical conductors such as aluminum and other metals, but there are no available techniques to repair transparent conductors such as indium tin oxide (ITO) and zinc oxide (ZnO) which are two of the most popular transparent conductors.

Liquid metal cluster ion source deposition is a technique whereby thin and medium layers of pure metals and alloys can be directly deposited in a desired pattern on a variety of substrates. These direct write tools have been used for mask repair or via hole etching, but they have not been used as a metal source to provide oxide or other metal and gas compound lines. That is, an oxide, nitride or other ceramic material cannot be used in a liquid metal cluster source because of the relatively high melting points required for these materials. Therefore, when the need has arisen for the deposit of a metal oxide, an alternate approach has been to use a metallic source to write metal lines and oxidize them later. However, this cannot be done for transparent conductors due to the very high temperatures required to obtain the transparency and due to the formation of other phases which degrade the electrical conductivity. Another alternative is to oxidize the metal line while it is being fabricated. One of the problems with the use of oxygen in a chamber with a liquid metal cluster ion source is that the metal on the source oxidizes faster than the deposited metal due to the high metal temperature at the source. This oxidation can poison the liquid metal source and stop proper operation of the source.

The present invention solves the problem of applying a metal and gas compound on a surface by the use of a liquid metal cluster ion source by allowing the gas to combine with the metal while it is being fabricated while isolating the gas from the metal cluster ion source.

SUMMARY

The present invention is directed to a method of applying a compound of a metal and a reactive gas onto a surface which includes depositing a metal on the surface by localized metal cluster ion deposition, depositing the metal in the presence of the gas, and isolating the gas from the source of the metal cluster ion.

Another object of the present invention is wherein the gas is isolated from the source by the use of an inert gas.

Still a further object is wherein the compound is an oxide and the gas includes oxygen and is selected from a group consisting of oxygen, ozone and nitrous oxide.

Still a further object of the present invention is wherein the compound is selected from a group consisting of oxides, nitrides, and sulfides.

Yet a still further object of the present invention is wherein the ion source is under a vacuum, the gas is under a partial pressure, and the inert gas is under a greater pressure than the source and the gas.

Yet a still further object of the present invention is the method of applying a metal to repair an electrical display having a transparent conductor by depositing the metal on the transparent conductor by a liquid metal cluster source ion deposition in the presence of oxygen and isolating the source from the oxygen by an inert gas. The method further includes providing in-situ oxidation of the deposited metal by an atomic oxygen plasma device. In one embodiment the metal is selected from a group consisting of indium, tin and zinc.

Yet still a further object of the present invention is the provision of an apparatus for applying a compound of a metal and a reactive gas on a surface which includes first and second compartments with a liquid metal cluster ion source positioned in the first compartment for generating an ion beam and directing the ion beam into the second compartment. The surface is positioned in the second compartment for receiving the ion beam and the deposited metal. Gas is provided in the second compartment for combining with the deposited metal and means are provided for isolating the gas in the second compartment from the source in the first compartment. Yet a still further object is wherein the isolating means includes a third compartment positioned between the first and second compartments which contains an inert gas.

Still a further object of the present invention is an apparatus for applying a compound of a metal and a reactive gas on a substrate which includes first, second and third compartments in which the third compartment is positioned between the first and second compartments. A first small opening is provided between the first and third compartments and a second small opening is provided between the second and third compartments. A liquid metal cluster ion source with its own focussing column is positioned in the first compartment for generating and directing an ion beam through the first and second openings and into the second compartment. A substrate is positioned in the second compartment for receiving the ion beam and the gas is provided in the second compartment for combining with the deposited metal to form a compound. The third compartment has an inert gas therein for isolating the gas in the second compartment from the source in the first compartment. Preferably, an oxygen plasma device is positioned in the second compartment.

Still a further object of the present invention is wherein the first compartment is subjected to a vacuum, the gas in the second compartment is under partial pressure, and the inert gas in the third compartment is under a greater pressure than the first and second compartments.

Other and further objects, features and advantages will be apparent from the following description of presently preferred embodiments of the invention, given for the purpose of disclosure, and taken in conjunction with the accompanying drawings.

DESCRIPTION OF THE PREFERRED EMBODIMENT

Figure 1:
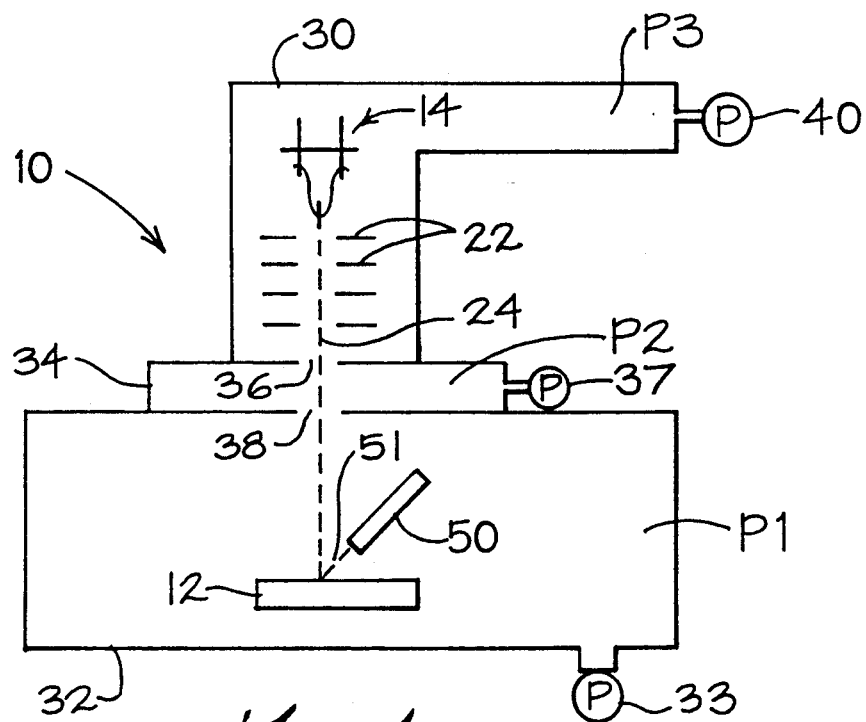
FIG. 1 is an elevational schematic drawing of one apparatus of the present invention.

While the present invention will be described in connection with its use of repairing defects in transparent conductors of flat panel displays for purpose of illustration, it is to be understood that the present method and apparatus are directed to other applications of depositing a metal onto a surface by a metal cluster ion deposition and depositing the metal in the presence of and combining it with a gas.

Referring now to the drawings, the reference numeral 10 generally indicates the apparatus of the present invention for applying a compound of a metal and a reactive gas onto the surface of a substrate 12. In the particular illustration here used, the substrate 12 may be a transparent conductor of a flat panel display, such as a liquid crystal, electro-luminescent, field emission or plasma display. For example, the substrate 12 may include a transparent conductor made from indium tin oxide (ITO), tin oxide (TO) or zinc oxide (ZnO) which are three of the most popular transparent conductors. The substrate 12 may be placed on a computer controlled X-Y stage to move the substrate in a desired manner with respect to the LMCS beam.

A liquid metal cluster ion source 14 provides a direct write or repair tool whereby thin and medium layers of metals and alloys can be directly deposited on the substrate 12 in the desired pattern. Ions and charged droplets or clusters of the desired metal in the molten state are generated and accelerated by the field emission technique. The liquid metal cluster ion source 14 has the advantages of excellent adhesion of the deposited metal to all types of substrates, inherent surface cleaning capability, well controlled microstructure with almost bulk density and few defects such as voids, extreme fine resolution is possible, and it can also be operated in the etch mode whereby shorting type defects can be repaired.

Figure 2:
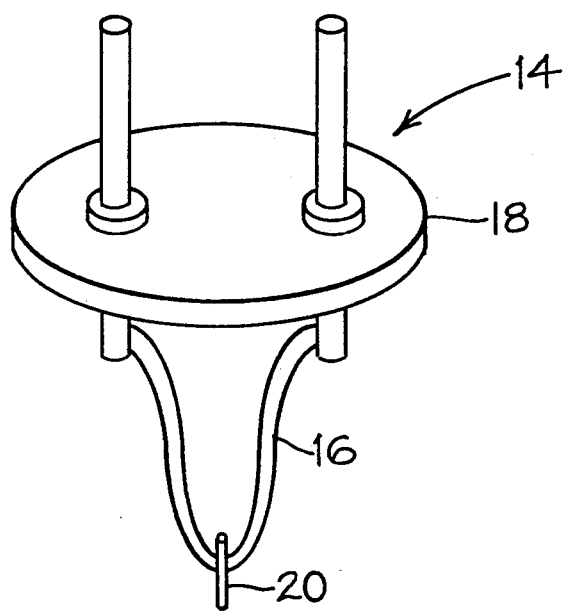
FIG. 2 is an enlarged schematic perspective elevational view of a liquid metal cluster ion source suitable for use in the present invention.

Referring now to FIG. 2, the liquid metal source in its simplest form consists of a tungsten wire loop reservoir 16 is attached to a ceramic base 18, and a small tungsten wire 20 is spotwelded to the loop 16 at its apex. The loop reservoir 16 is charged with the appropriate metal, is resistively heated by passing current therethrough and after the metal melts, the metal wets the needle 20. An electric field is applied to the liquid metal surface by positively biasing the needle 20 with respect to one or more extractor rings 22 (FIG. 1). The liquid surface on the needle 20 becomes electrohydrodynamically unstable, leading to the formation of a conical protrusion on the surface of the liquid at the place where the electric field is strong enough. When the apex electrical field becomes large enough, ion emission takes place in the ion beam 24 and metal deposition or sputter etching can take place on the substrate 12. The ion beam source 14 may be any suitable liquid metal ion source, such as more fully described in patent application Ser. No. 07/653,609, filed Feb. 11, 1991, entitled "Method of Making Bonding Bumps," or as disclosed in C. D'Kruz and K. Pourrezaei, "Ion Cluster Emission and Deposition from Liquid Gold Ion Sources", *Journal of Applied Physics*, Vol. 58 (7) Oct. 1, 1985, pages 2724–2730. These disclosures are hereby incorporated by reference. However, it is understood that the present invention may use an unfocused liquid metal ion beam to repair or deposit metal on the substrate 12. This can be done by bringing the substrate 12 in close proximity to the tip of the liquid ion metal source. Repair of a substrate will, of course, require a focussed ion beam as is understood by those skilled in the art.

Nevertheless, with all of the advantages of the liquid metal ion source 14, an oxide or ceramic material cannot be used in the source 14 because of the relatively high melting point required for these materials. Therefore, the source 14 cannot write oxidized metal lines on the substrate 12. One alternative approach would be to use the metallic source 14 to write metal lines on the substrate 12 and oxidize them later. However, for transparent conductors, the high temperatures required to obtain the transparency leads to formations of other phases degrading the electrical conductivity of the transparent conductors. Instead, the present invention is directed to oxidizing the metal line while it is being fabricated on the substrate 12. However, one of the problems when using oxygen to oxidize the metallic film being formed on the substrate 12 is that the oxygen cannot be used in the presence of the liquid metal source 14. That is, using oxygen in the source 14 causes the metal in the source to oxidize faster due to the higher metal temperature of the source 14. This oxidation can poison the source 14 and stop proper operation of the source 14.

The above problems are solved by the apparatus 10 shown schematically in FIG. 1. The liquid metal source 14 is positioned in a first compartment 30 and the substrate 12 is positioned in a second compartment 32. A third compartment 34 is positioned between the first compartment 30 and the second compartment 32. Therefore, the source 14 is isolated from the deposition chamber in the compartment 32. A small orifice or opening 36 is provided between the first and third compartments 30 and 34, respectively, and a second small opening 38 is provided between the second and third compartments 32 and 34, respectively. The openings 36 and 38 are usually 1 mm in diameter, but can be larger or smaller. The ion cluster beam 24 can pass through the openings 36 and 38, but a pressure can be maintained across the openings 36 and 38 so that different pressures can be maintained in the different compartments 32 and 34. Therefore, oxygen can be provided at a pressure P1 in the second compartment 32 for oxidizing the metal deposited on, the substrate 12 while it is being fabricated. This is done by feeding a required partial pressure of oxygen into the chamber 32 through pump 33. The pressure P3 in chamber 30 may be provided under a vacuum caused by vacuum pump 40 to provide the necessary high vacuum for operation of the source 14. To stop diffusion of oxygen from the deposition chamber of compartment 32 into the source chamber of compartment 30, the pressure P2 in the third compartment 34 is maintained with an inert gas feed such as argon or helium through pump 37. For example only, in operation, the pressure P3 is less than $10^{-5}$ torr, the pressure P1 in chamber 32 is usually $10^{-4}$ torr of oxygen or other gasses such as ozone or nitrous oxide, and the pressure P2 in chamber 34 is kept at $10^{-3}$ torr. Therefore, the higher pressure in compartment 34 provides a differential pressure which, while allowing the passage of the ion beam 24 therethrough, prevents the oxygen in chamber 32 from escaping into the source compartment 30, while at the same time oxygen is being fed into the compartment 32 by pump 33 to oxidize the metal being deposited on the substrate 12.

Referring again to FIG. 1, an atomic oxygen plasma device 50 may be provided in the compartment 32 to provide an in-situ oxidation of the metal deposited on the substrate 12. The plasma device 50 is positioned such that the gas plasma 51 hits the substrate 12 in the same spot as the LMCS beam 24. This is desirable for obtaining good optical transparency and electrical conductivity. Any suitable plasma devices may be used, such as those described in U.S. Pat. Nos. 4,088,926 and 4,710,283, which are herewith incorporated by reference.

Figure 3:
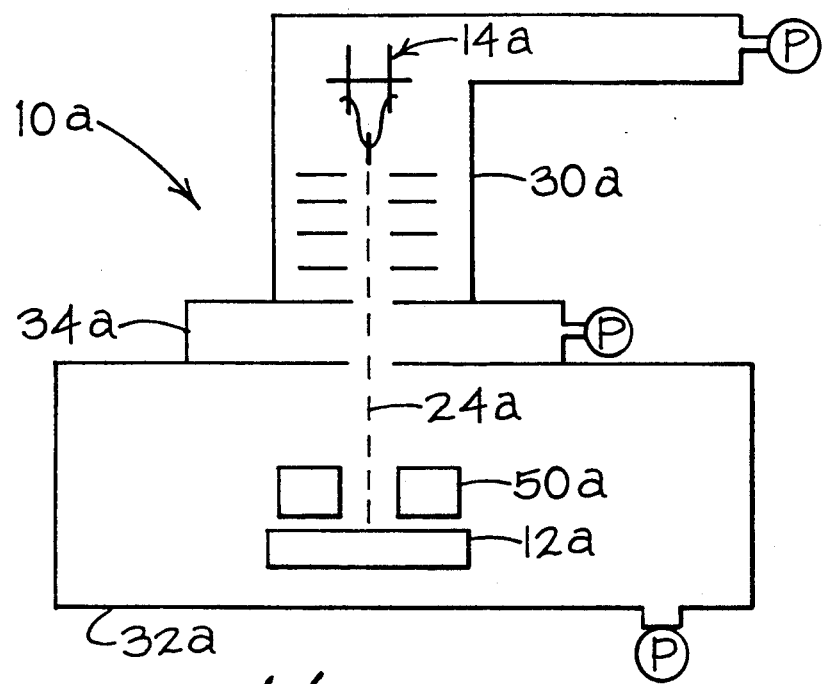
FIG. 3 is a schematic elevational view of another embodiment of the present invention.
Figure 4:
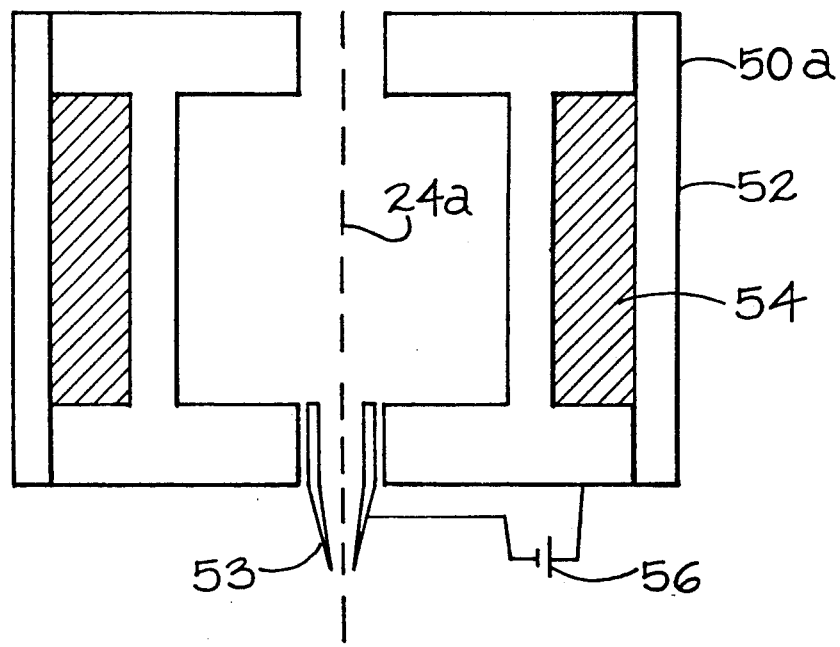
FIG. 4 is an enlarged schematic elevational view of the atomic oxygen plasma device shown in FIG. 3.

Other and further embodiments may be provided and as shown in FIG. 3 another embodiment is seen wherein like parts to those described in connection with FIGS. 1 and 2 are similarly numbered with the addition of the suffix "a". The apparatus 10a is similar to that described in connection with FIG. 1 except that a hollow cathode plasma device 50a is used in place of the plasma device 50 shown in FIG. 1. The axis of device 50a coincides with the LMCS beam to assure that the beam passes through the plasma. Referring to FIG. 4, the atomic oxygen hollow cathode plasma device 50a is shown in greater detail which includes a housing 52 with an electromagnet 54 to provide a magnetic field. An electrical power source 56 is connected between the housing 52 and guide 53, such as a dc voltage in the order of 300 to 1,000 volts to provide an electrostatic field. When ionizable fluid, such as oxygen, is provided, the fluid is transformed into a plasma to mix with the ion beam 24a to provide a metal oxide. In use, the source 14 may apply any suitable metal, and in the case of a flat panel display having a transparent conductor substrate 12, the metal may be indium tin or zinc, the oxygen in compartment 32 may be obtained from oxygen, ozone or nitrous oxide, and any suitable inert gas may be used in compartment 34, such as argon or helium.

While the present method and apparatus has been described, for purposes of illustration only, as depositing a metal oxide on a transparent conductor, the present method and apparatus is useful in applying other metals and gas compounds onto a surface. In particular, the present invention is useful in applying nitrides and sulfides as well as oxides.

For example, titanium nitride, which is useful for a diffusion barrier and adhesion barrier for various types of substrates, can be formed by the combination of titanium using $NH_3$ or $N_2$. And zinc sulfide which is useful as a phosphor for TV screens may be formed using zinc and $H_2S$.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, and steps of the process, will be readily apparent to those skilled in the art, and which are encompassed within the spirit of the invention, and the scope of the appended claims.

What is claimed is:

1. A method of applying a compound of a metal and a reactive gas to repair lines on an electrical display having a transparent conductor, comprising,
   selectively depositing said metal on the transparent conductor by a focused liquid metal cluster source ion deposition in the presence of a reactive gas,
   isolating the ion source from the reactive gas by inserting an inert gas spaced from the ion source and between the ion source and the reactive gas at a pressure greater than the pressure of the reactive gas.

2. The method of claim 1 wherein the compound is an oxide and the reactive gas includes oxygen.

3. The method of claim 2 wherein the reactive gas is selected from a group consisting of oxygen, ozone, and nitrous oxide.

4. The method of claim 2 wherein the compound is selected from a group consisting of oxides, nitrides, and sulfides.

5. The method of claim 1 including,
   providing in-situ oxidation of the deposited metal by an atomic oxygen plasma device.

6. The method of claim 1 wherein the metal is selected from a group consisting of indium, tin, and zinc.

7. The method of claim 1 wherein the reactive gas is oxygen.

8. An apparatus for applying a compound of a metal and a reactive gas on a substrate, comprising,
   first, second, and third compartments, said third compartment positioned between the first and second compartments,
   a first small opening between the first and third compartments, and a second small opening between the second and third compartments,
   a liquid metal cluster ion source positioned in the first compartment for generating and directing an ion beam of said metal through the first and second openings and into the second compartment,
   said second compartment having a substrate mounted on an X-Y stage and positioned for receiving the ion beam and the metal deposited therefrom,
   said second compartment also having means for supplying a reactive gas therein for combining with the deposited metal,
   said third compartment having means for supplying an inert gas therein at a greater pressure than the means for supplying reactive gas for isolating the reactive gas in the second compartment from the ion source in the first compartment.

9. The apparatus of claim 8 including,
   an atomic oxygen plasma device positioned in the second compartment.

10. The apparatus of claim 8 including,
    a vacuum pump connected to the first compartment for subjecting the ion source to a vacuum.

11. The apparatus of claim 8 including,
    an oxygen plasma device positioned in the second compartment.

* * * * *

UNITED STATES PATENT AND TRADEMARK OFFICE
CERTIFICATE OF CORRECTION

PATENT NO. : 5,196,102
DATED : March 23, 1993
INVENTOR(S) : Nalin Kumar

It is certified that error appears in the above-indentified patent and that said Letters Patent is hereby corrected as shown below:

```
Column 1, line 13, delete "oxice" and insert -- oxide --
Column 1, line 15, delete "oft he" and insert -- of the --
Column 3, line 49, delete "extreme" and insert -- extremely --
Column 6, line 20, delete "2" and insert -- 1 --
Column 6, line 23, delete "2" and insert -- 1 --
Column 6, line 36, delete"betweer" and insert -- between --
```

Signed and Sealed this

Fifteenth Day of March, 1994

Attest:

BRUCE LEHMAN

*Attesting Officer*  *Commissioner of Patents and Trademarks*